(12) United States Patent
Fabbro

(10) Patent No.: US 11,342,855 B2
(45) Date of Patent: May 24, 2022

(54) CONTROLLING A SWITCH ACROSS AN ISOLATION BARRIER

(71) Applicant: Infineon Technologies Austria AG, Villach (AT)

(72) Inventor: Simone Fabbro, Udine (IT)

(73) Assignee: Infineon Technologies Austria AG, Villach (AT)

( * ) Notice: Subject to any disclaimer, the term of this patent is extended or adjusted under 35 U.S.C. 154(b) by 112 days.

(21) Appl. No.: 16/852,114

(22) Filed: Apr. 17, 2020

(65) Prior Publication Data

US 2021/0328519 A1 Oct. 21, 2021

(51) Int. Cl.
*H02M 3/335* (2006.01)
*H03K 17/689* (2006.01)

(52) U.S. Cl.
CPC ... *H02M 3/33576* (2013.01); *H02M 3/33523* (2013.01); *H03K 17/689* (2013.01)

(58) Field of Classification Search
CPC .............................................. H02M 3/335–42
See application file for complete search history.

(56) References Cited

U.S. PATENT DOCUMENTS

| 4,748,351 A | 5/1988 | Barzegar |
| 4,970,420 A | 11/1990 | Billings |
| 9,966,837 B1 * | 5/2018 | Seaton ..................... H02M 1/08 |
| 2010/0072971 A1 | 3/2010 | Nuebling et al. |
| 2012/0212075 A1 * | 8/2012 | Arnet ....................... H02M 1/08 307/113 |
| 2015/0365097 A1 * | 12/2015 | Jadus .................. H03M 1/0836 323/281 |
| 2016/0006337 A1 | 1/2016 | Thalheim et al. |
| 2021/0067044 A1 * | 3/2021 | Barchowsky .......... B64G 1/428 |

FOREIGN PATENT DOCUMENTS

| JP | H11 195972 A | 7/1999 |
| JP | 2013 187488 A | 9/2013 |

OTHER PUBLICATIONS

European Search Report from Corresponding European Patent Application No. 21020210.7, dated Aug. 16, 2021.

* cited by examiner

*Primary Examiner* — Peter M Novak
(74) *Attorney, Agent, or Firm* — Cooper Legal Group LLC

(57) ABSTRACT

An apparatus comprises an energy transfer device that operates one or more input switches of an input side of an electrical isolation device to transfer energy through the isolation device to an output side of the electrical isolation device for activating a switch. The apparatus comprises a voltage conversion device that converts the energy from an input voltage of the input side to an output voltage to control the switch when the energy transfer is active. The apparatus comprises a passive turn off device that passively deactivates the switch when the energy transfer is inactive. The passive turn off device is disabled from deactivating the switch when the energy transfer is active.

20 Claims, 5 Drawing Sheets

CONTROLLING A SWITCH ACROSS AN ISOLATION BARRIER

TECHNICAL FIELD

The present disclosure relates to the field of operating switches through isolation barriers.

BACKGROUND

Various types of devices may utilize switches, such as solid state switches. A switch may be controlled from a power domain of the device. The power domain may be isolated with respect to a region of the device at which the switch is located. Isolation is achieved by using an optical isolation barrier. The optical isolation barrier is positioned within the device between a first side of the device comprising the power domain and a second side of the device comprising the switch. In order to control the switch through the optical isolation barrier, information and/or energy has to be sent across the optical isolation barrier. Unfortunately, there are prohibitively high manufacturing costs associated with manufacturing optically isolated switches.

Many existing solutions, such as alternatives to optical isolation using galvanic isolation based on capacitive coupling or transformer coupling that both require integration capabilities, have various drawbacks. One such drawback is the requirement of additional specific supply pins at one or more sides of an isolation barrier. Another drawback is the inability to integrate an isolation barrier and a solid state switch into a same package. Yet another drawback is the inability to provide pin to pin compatibility with other isolation devices meant for driving solid state switch, such as optocouplers or solid state relays. Furthermore, existing isolation solutions are not always able to generate voltages on an output side of the isolation barrier (e.g., the second side at which the switch is located) that are higher than voltages at an input side of the isolation barrier (e.g., the first side where the power domain is located). This greatly constrains and limits the types of switches that can be utilized because such switches would have to have a threshold voltage compatible with an input voltage range, which may be prohibitively low in relation to voltages used to operate the switches. One drawback for capacitive isolation is common mode transient immunity between the two sides of an isolation barrier, which can quickly move their potential in opposite directions. Although some products may combine one or more of these isolation solutions and/or features thereof, there is no current product that addresses all of the aforementioned deficiencies at the same time.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, a method is provided. The method includes operating one or more input switches of an input side of an isolation device according to a frequency and a duty cycle to transfer energy through the isolation device during a sequence of switching cycles to an output side of the isolation device for activating a switch. A voltage conversion device converts the energy from an input voltage of the input side to an output voltage to control the switch. A passive turn off device is disabled from deactivating the switch when the energy transfer is active. The passive turn off device passively deactivates the switch when the energy transfer is inactive.

In an embodiment of the techniques presented herein, an apparatus is provided. The apparatus includes a means for operating one or more input switches of an input side of an isolation device according to a frequency and a duty cycle to transfer energy through the isolation device during a sequence of switching cycles to an output side of the isolation device for activating a switch. The apparatus comprises a means for converting the energy from an input voltage of the input side to an output voltage to control the switch. The apparatus comprises a means for passively deactivating the switch when the energy transfer is inactive. The apparatus comprises a means for disabling the deactivation of the switch when the energy transfer is active.

In an embodiment of the techniques presented herein, an apparatus is provided. The apparatus comprises an energy transfer device configured to operate one or more input switches of an input side of an isolation device according to a frequency and a duty cycle to transfer energy through the isolation device during a sequence of switching cycles to an output side of the isolation device for activating a switch. The apparatus comprises a voltage conversion device configured to convert the energy from an input voltage of the input side to an output voltage to control the switch when the energy transfer is active. The apparatus comprises a passive turn off device configured to passively deactivate the switch when the energy transfer is inactive. The apparatus comprises a negative charge pump configured to disable the passive turn off device from deactivating the switch when the energy transfer is active.

In an embodiment of the techniques presented herein, an apparatus is provided. The apparatus comprises an energy transfer device configured to operate one or more input switches of an input side of an electrical isolation device to transfer energy through the isolation device to an output side of the electrical isolation device for activating a switch. The apparatus comprises a voltage conversion device configured to convert the energy from an input voltage of the input side to an output voltage to control the switch when the energy transfer is active. The apparatus comprises a passive turn off device configured to passively deactivate the switch when the energy transfer is inactive, wherein the passive turn off device is disabled from deactivating the switch when the energy transfer is active.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
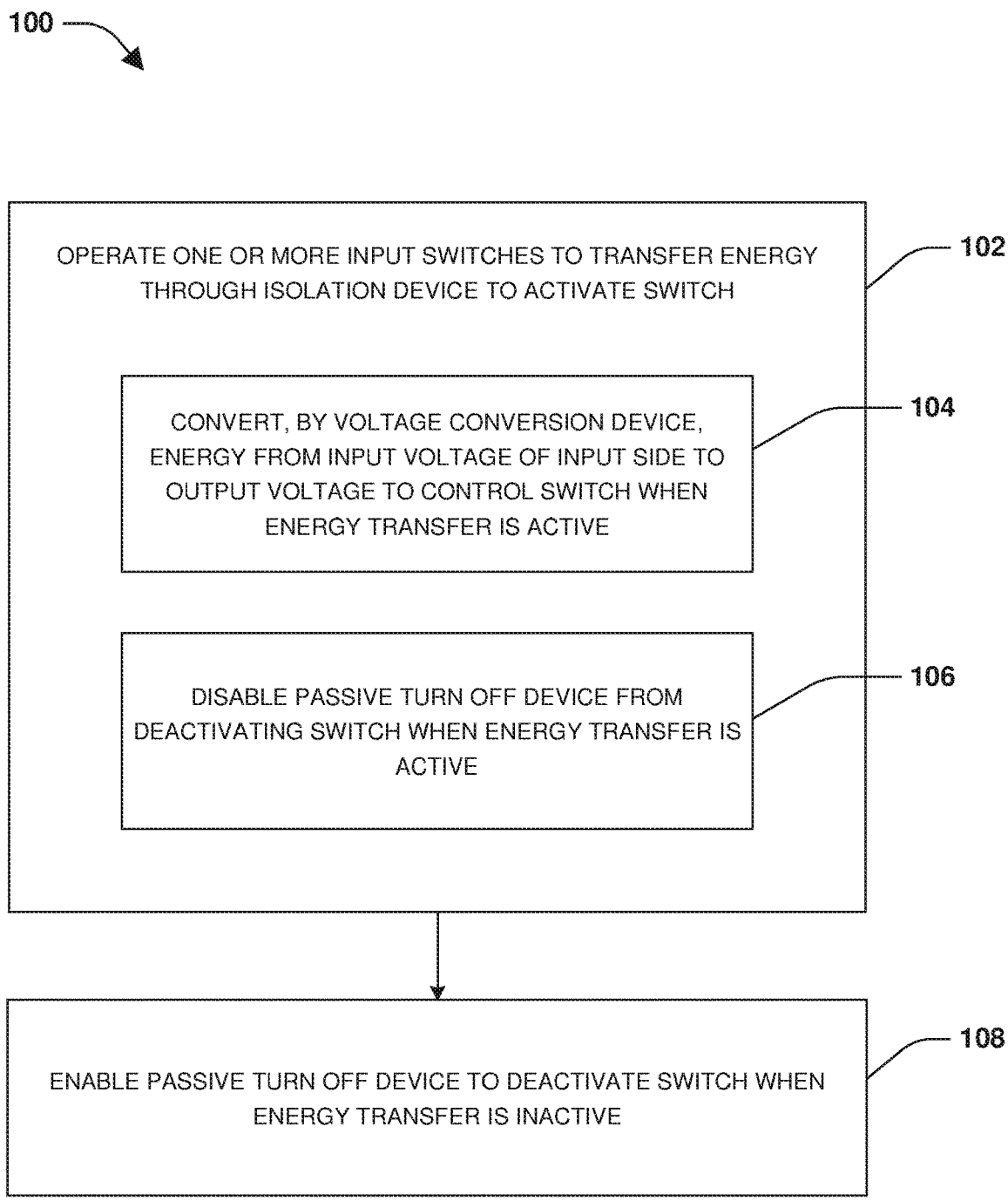
FIG. 1 is an illustration of an example method of operating a switch through an isolation device in accordance with the techniques presented herein.
Figure 2:
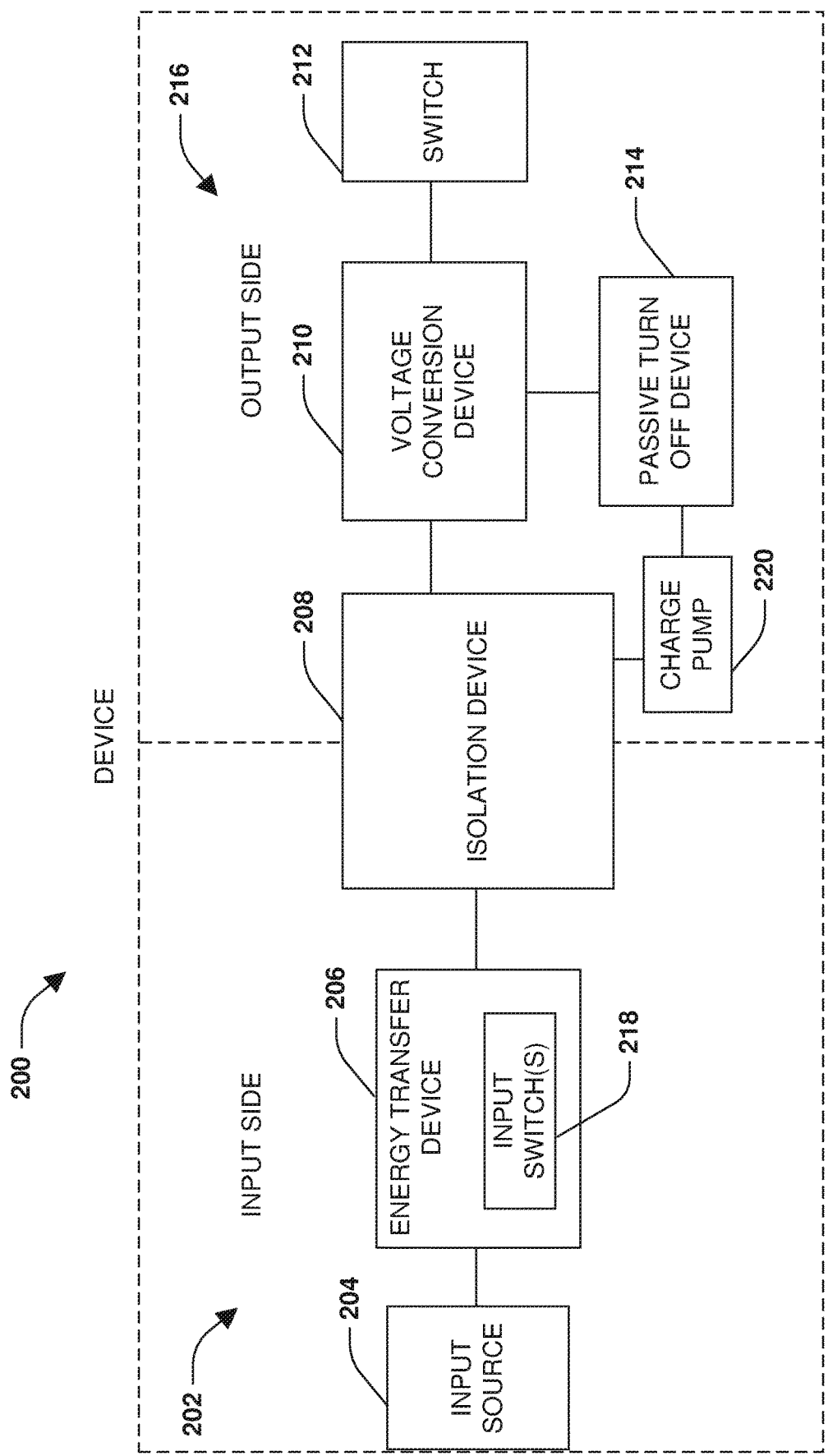
FIG. 2 is a component block diagram illustrating an apparatus for operating a switch through an isolation device in accordance with the techniques presented herein.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, a device comprises a switch that is to be controlled from a region of the device, such as a power domain region of the device, which is to be isolated from the switch. The ability to operate the switch is improved by using electrical isolation, such as by utilizing a capacitive coupling, a transformer such as a core or coreless transformer or any other type of transformer, or other electrical isolation barrier. The electrical isolation barrier can be used in a manner that does not introduce topological differences or penalties in the device, and thus the device can be easily swapped with other existing devices without introducing noticeable differences, such as in device size, package, or pinout. For example, pin to pin compatibility is provided because there is no need for additional pins otherwise used to provide a specific power supply on either side of the electrical insolation barrier.

The techniques and apparatuses provided herein are capable of transmitting an adequate amount of energy from a first side of the device (e.g., a side within which the power domain region is located), through the electrical isolation barrier, to a second side of the device within which the switch is located. The energy is transferred during a sequence of switching cycles so that the switch, such as a solid state switch, can be properly and reliably turned on with sufficient speed and without the need of additional energy from the second side. Furthermore, power to the switch is safely turned off with sufficient speed without having to transfer energy across the electrical isolation barrier and without the need of external components.

In an embodiment, an integrated energy transfer process across an isolation barrier, such as an electrical isolation barrier, is provided. Energy is transmitted from an input side of the isolation barrier to an output side of the isolation barrier to ensure proper, complete, and safe turn on of a switch, such as a solid state switch, located at the output side. The energy is transferred during a sequence of switching cycles during which energy transfer is either active or inactive. The switch is turned on with sufficient speed and without the need of additional energy from the output side. This may be accomplished by performing an On-Off Keying technique used to store and release electromagnetic energy across the isolation barrier for transmission to the output side in a manner that is compatible with energy losses allowed by the isolation barrier. The On-Off Keying consists of a high frequency pulsed drive at the input side, where a drive between an input power supply and an input ground is applied with a switching pattern to input terminals of the isolation barrier. In order to interrupt the energy transfer process, the switching pattern is stopped so that no current flow takes place within the isolation barrier. Various types of energy transfer devices may be utilized to perform the integrated energy transfer process.

In an embodiment, an output voltage can be generated on the output side that is high enough to ensure that various types of switches can be used, such as metal-oxide-semiconductor field effect transistors (MOSFETs), insulated-gate bipolar transistors (IGBTs), or other types of switches. The output voltage may be relatively higher than the input voltage used at the input side. This may be accomplished by utilizing various voltage boosting rectifying topologies, which may be coupled to the output side, such as a flyback converter, a voltage multiplier (e.g., a Cockroft-Walton voltage multiplier), or other types of voltage conversion device. A voltage conversion device may be used to reach an output voltage capable of driving a gate of the switch, which may be a higher voltage than used at the input side. Activation of the power conversion process of the voltage conversion device is activated and controlled according to the On-Off Keying at the primary side. In an embodiment, some auxiliary functions, such as current sensing or temperature sensing for the switch, may be powered at the output side by the output voltage provided by the voltage conversion device.

In an embodiment, a reliable passive turn off path is provided for the gate of the switch. This may be accomplished by utilizing various integrated technology options, such as depletion MOSFETs (e.g., an n channel depletion MOSFET or a p channel depletion MOSFET) or other types of passive turn off devices, which have a conductive channel even without being actively driven (e.g., without being actively provided with power). A passive turn off device may be capable of reliable passive turn off of the switch while no energy transfer is being performed from the input side to the output side.

In an embodiment, the passive turn off device may be quickly and reliably deactivated as soon as the energy transfer process starts. Activation and deactivation of the passive turn off device occurs without the need of additional energy from either the input side or the output side. Deactivation of the passive turn off device may be accomplished through the On-Off Keying process, which generates a negative voltage at the output side by means of a negative charge pump coupled to the insolation barrier (e.g., coupled to secondary windings of a transformer used as the isolation barrier). By means of the negative charge pump, as soon as the On-Off Keying process starts, a gate of the passive turn off device, such as a depletion MOSFET (e.g., a depletion n channel MOSFET), can be actively driven below its source to prevent the depletion MOSFET from conducting, in an embodiment. In this way, the depletion MOSFET is deactivated. This allows a rising voltage that drives the switch to turn the switch on. Once the On-Off Keying process stops, loading of the negative charge pump should discharge the negative voltage at an output and allow again for the conduction of the depletion MOSFET. In particular, a passive discharge element (e.g., a resistor connecting the source and the gate of the depletion MOSFET) will bring the source and the gate of the depletion MOSFET to a same voltage, thus activating the depletion MOSFET. Once the energy transfer stops, the passive discharge element nulls the voltage previously generated by the negative charge pump with a suitable time constant. In an embodiment, a charge pump may be utilized to generate a positive voltage for controlling a depletion p channel MOSFET as opposed to the depletion n channel MOSFET.

In this way, electrical isolation is provided for devices in a manner that allows for reliable, safe, and quick control of a switch, such as a solid state switch without introducing topological differences or penalties.

An embodiment of controlling a switch across an isolation barrier is illustrated by an exemplary method 100 of FIG. 1 and further described in conjunction with FIGS. 2-4B. An apparatus, such as device 200 of FIG. 2, comprises an isolation device 208 that isolates an input side 202 of the device 200 from an output side 216 of the device 200. The isolation device 208 may comprise an electrical isolation device that provides electrical isolation between the input side 202 and the output side 216 of the device 200. In an embodiment, the isolation device 208 comprises a transformer, such as a coreless transformer or a core transformer (e.g., transformer 310 of FIG. 3 and transformer 404 of FIG. 4). In an embodiment, the isolation device 208 comprises a capacitive coupling (e.g., capacitive coupling 456 of FIG. 4B). The isolation device 208 provides galvanic isolation between the input side 202 and the output side 216.

The input side 202 comprises an input source 204. The input source 204 may be associated with an input power domain that supplies an input voltage for the input side 202. The input side 202 may comprise one or more input switches 218 (e.g., a single input switch SWin 304 of FIG. 3 or a first input switch SW1A 418, a second input switch SW1B 422, a third input switch SW2A 420, and a fourth input switch SW2B 424 of FIGS. 4A and 4B). The input side 202 comprises an energy transfer device 206 configured to operate the one or more input switches 218 to perform a plurality of switching cycles for transferring energy through the isolation device 208 to the output side 216 for controlling a switch 212 located at the output side 216 of the device 200. The plurality of switching cycles correspond to a sequence of switch cycles where energy transfer is either active or inactive. The energy transfer device 206 may operate the one or more switches 218 according to a frequency (e.g., a switching frequency) and a duty cycle to transfer the energy through the isolation device 208 during a switching cycle for activating the switch 212. In an embodiment, an On-Off Keying technique is utilized by the energy transfer device 206 to perform a plurality of switching cycles for transferring the energy through the isolation device 208 for operating the switch 212.

Accordingly, at 102, the one or more input switches 218 are operated according to the frequency and the duty cycle to transfer the energy through the isolation device 208 during a sequence of switching cycles for activating the switch 212. In an embodiment, the On-Off Keying is applied by operating the one or more input switches 218 according to a determined frequency and duty cycle. The frequency may be set to a high enough value in order to limit a current flow through a primary winding of the isolation device 208 (e.g., a transformer) within a switching cycle. Depending on whether a flyback converter (e.g., FIG. 3) or a voltage multiplier (e.g., FIGS. 4A and 4B) is utilized as a voltage conversion device 210 at the output side 216, different duty cycles may be utilized. For example, the duty cycle may be set to 50% for the voltage multiplier where energy is driven by the energy transfer device 206 according to a push and pull manner. In this example, the switching cycle comprises a first phase where input current flows from a top terminal of the isolation device 208 to a bottom terminal of the isolation device 208. The switching cycle comprises a second phase where input current flows from the bottom terminal to the top terminal. For the flyback converter, the duty cycle may be set based upon the switching frequency so that an inductance across the isolation device 208 does not reach a saturation point or reliability issues do not occur.

If the one or more input switches 218 are kept off by the energy transfer device 206, then no energy transfer takes place. If the one or more switches 218 are turned on by the energy transfer device 206, then energy is transferred through the isolation device 208 to the output side 216 for turning on the switch 212. In this way, a sequence of switching cycles are performed where energy transfer is either active or inactive.

The device 200 comprises the voltage conversion device 210 located at the output side 216 of the device 200. The voltage conversion device 210 may comprise a flyback converter (e.g., FIG. 3), a voltage multiplier (e.g., FIGS. 4A and 4B) such as a Cockroft-Walton voltage multiplier, or other voltage conversion device. The voltage conversion device 210 may be configured to convert the energy transferred by the energy transfer device 206 from the input voltage associated with the input source 204 to an output voltage capable of controlling, such as turning on, the switch 212. In an embodiment, the voltage conversion device 210 may convert the input voltage to a relatively higher voltage as the output voltage capable of turning on the switch 212 (e.g., turning on a gate of a solid state switch). In this way, various types of switches 212 can be used that could otherwise not be operable/compatible with the relatively lower input voltage associated with the input source 204. The voltage conversion device 210 outputs the output voltage when the energy transfer by the energy transfer device 206 is active. Accordingly, at 104, energy is converted from the input voltage of the input side 202 to the output voltage to control the switch 212 when the energy transfer is active.

Figure 3:
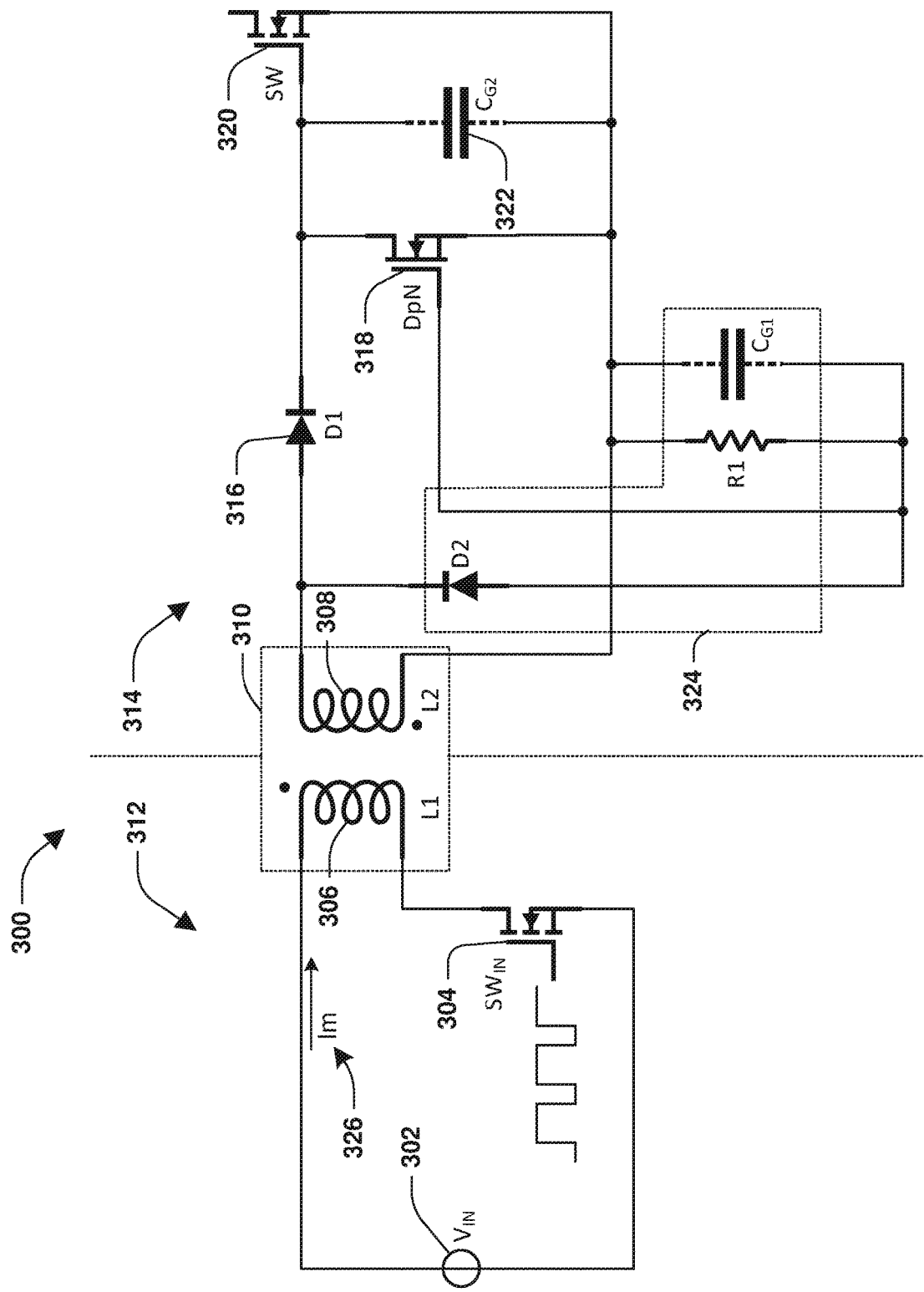
FIG. 3 is a component block diagram illustrating an apparatus with a flyback converter, a transformer for operating a switch through an isolation device, the switch controlled by the apparatus, a negative charge pump, and a depletion NMOS as a passive turn off device in accordance with the techniques presented herein.
Figure 4A:
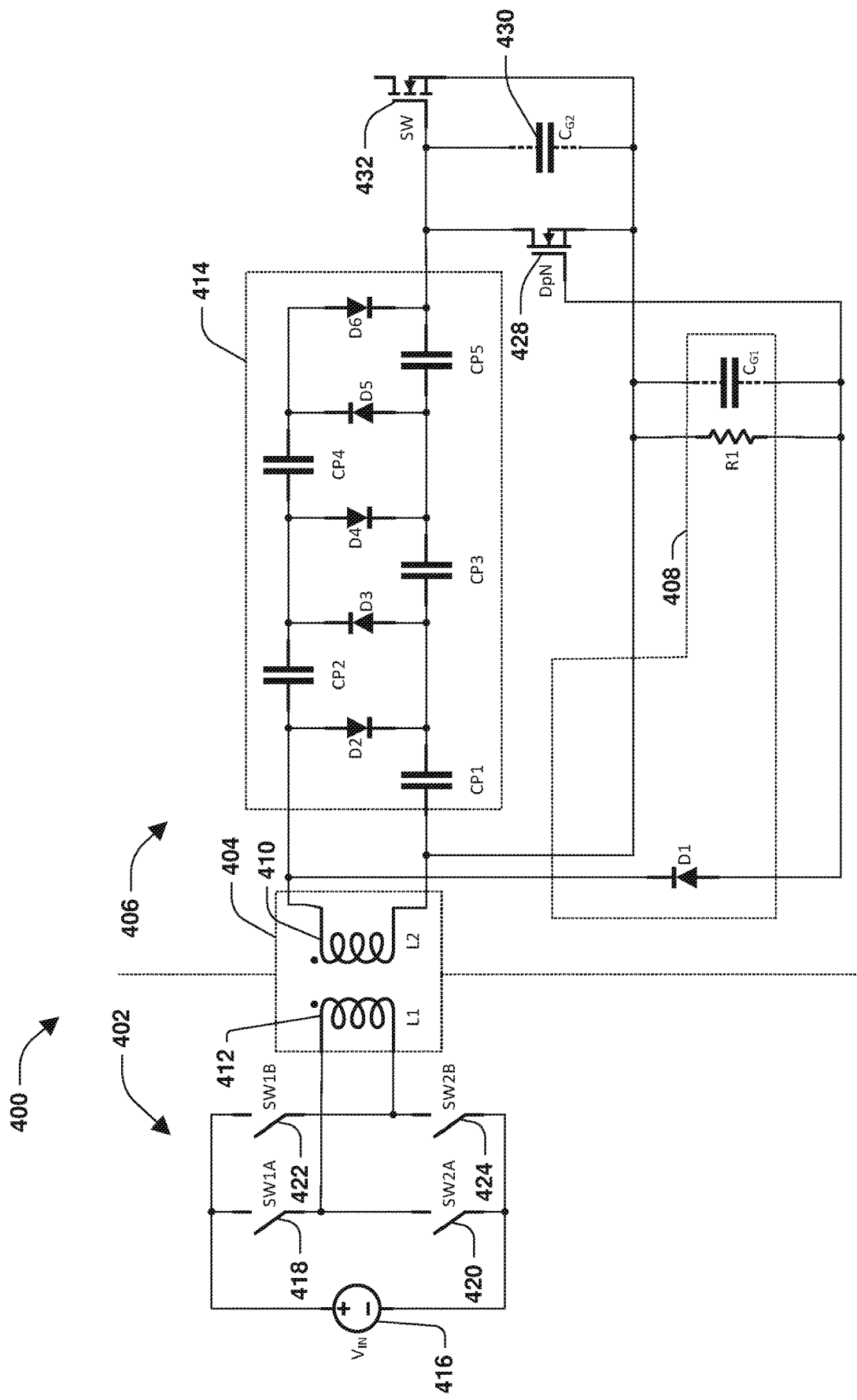
FIG. 4A is a component block diagram illustrating an apparatus with a voltage multiplier, a transformer for operating a switch through an isolation device, the switch controlled by the apparatus, a negative charge pump, and a depletion NMOS as a passive turn off device in accordance with the techniques presented herein.
Figure 4B:
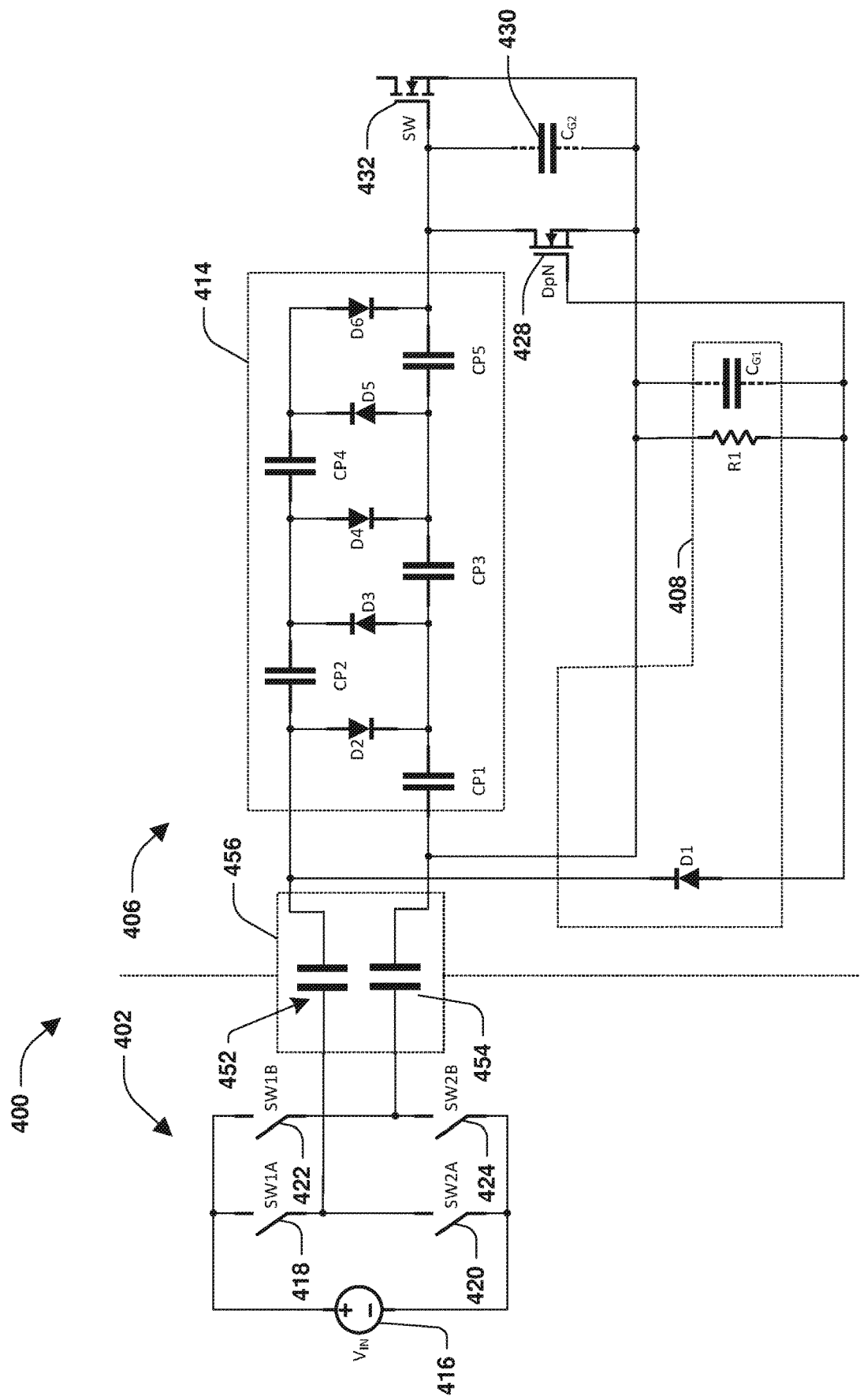
FIG. 4B is a component block diagram illustrating an apparatus with a voltage multiplier, a capacitive coupling for operating a switch through an isolation device, the switch controlled by the apparatus, a negative charge pump, and a depletion NMOS as a passive turn off device in accordance with the techniques presented herein.

The device 200 comprises a passive turn off device 214 at the output side 216 of the device 200 (e.g., passive turn off device 318 of FIG. 3 and passive turn off device 428 of FIGS. 4A and 4B). In an embodiment, the passive turn off device 214 comprises a depletion MOSFET (e.g., a depletion n channel MOSFET or a depletion p channel MOSFET). When no energy transfer is being performed by the energy transfer device 206 to otherwise activate the switch 212, the passive turn off device 214 passively (e.g., without the need for power to be supplied to the passive turn off device 214) deactivates the switch 212 to turn off the switch 212. For example, when there is no energy transfer, capacitors on the output side 216 are discharged, and thus a source and a gate of the passive turn off device 214 are at a same/similar potential, which creates a conduction channel between the source and the drain of the passive turn off device 214. The conduction channel acts like a resistor, sized according to dimensions of the passive turn off device 214, which applies a turn off strength between a gate and a source of the switch 212 to turn off the switch 212 (e.g., by shorting the gate of the switch 212 to the source of the switch 212). In this way, the passive turn off device 214 passively deactivates the switch 212, without being actively driven with power, when no energy transfer is being performed.

The passive turn off device 214 may be disabled from passively deactivating the switch 212 when the energy transfer is active. In an embodiment, a charge pump 220 (e.g., a positive charge pump for the depletion p channel MOSFET or a negative charge pump for the depletion n channel MOSFET, such as the negative charge pump 324 of FIG. 3) may be utilized to disable the passive turn off device 214 from passively deactivating the switch 212 when the energy transfer is active. With the depletion n channel MOSFET, the negative charge pump is utilized to actively drive down a gate of the depletion n channel MOSFET using a negative voltage to disable the depletion n channel MOSFET from passively deactivating the switch 212 when the energy transfer is active. In this way, the passive turn off device 214 is disabled from passively deactivating the switch 212 when the energy transfer is active, at 106. When the energy transfer is inactive, a load at an output of the negative charge pump discharges the negative voltage to enable the depletion n channel MOSFET to passively deactivate the switch 212. When there is no switching activity, the negative charge pump is inactive. In this way, the passive turn off device 214 is enabled to passively deactivate the switch 212 when the energy transfer is inactive, at 108.

FIG. 3 illustrates an embodiment of an apparatus 300 for operating a switch 320 through an isolation barrier. The apparatus 300 comprises a transformer 310 that operates as the isolation barrier to isolate, such as electrically isolate, an input side 312 of the apparatus 300 from an output side 314 of the apparatus 300. The switch 320 is located at the output side 314 of the apparatus 300. An input source 302 and an input switch 304 are located at the input side 312 of the apparatus 300. The switch 320, a passive turn off device 318 (e.g., a depletion p channel MOSFET), a voltage conversion device (e.g., a flyback converter that utilizes a diode D1 316 that is either forward biased or reversed biased based upon whether energy transfer is occurring), and a negative charge pump 324 are located at the output side 314 of the apparatus 300. The negative charge pump 324 may comprise a resistance R1 (a resistor R1), an equivalent capacitance Cg1, and/or a diode D2.

On-Off Keying is performed at the input side 312 to operate the input switch 304 to perform a sequence of switching cycles to transfer energy from the input side 312 (e.g., energy generated by the input source 302) to the output side 314 for operating the switch 320. In an embodiment, the input switch 304 is turned on at the start of a switching cycle to drive a lower terminal of a primary side 306 of the transformer 310. This creates a magnetization current Im 326 flowing into equivalent magnetization inductance Lm of the transformer 310. The magnetization current Im 326 of the transformer 310 will continue to increase so long as the input switch 304 is on. A duty cycle for switching the input switch 304 on and off is set based upon a switching frequency so that the magnetization current Im 326 does not reach a transformer saturation or result in transformer reliability issues for the transformer 310. While the input switch 304 is turned on and the magnetization current Im 326 is kept flowing into the primary winding of the transform 310, the secondary winding of the transformer 310, which provides an inverted voltage with respect to the voltage applied to the primary winding, keeps the diode D1 316 in reverse bias so that no current is flowing towards a gate of the switch 320. After this phase of the duty cycle, the input switch 304 is turned off, and the lower terminal of the primary side 306 of the transformer 310 is left floating.

The magnetic energy stored within the transformer 310 (e.g., corresponding to a peak magnetization current Im being reached in the prior phase where the input switch 304 was turned on) is output through the secondary side 308 of the transformer 310, causing a demagnetization current. Thus, the stored magnetic energy is released through a decreasing Idm (e.g., magnetic energy stored within the transformer 310) that appears at the secondary side 308 of the transformer 310, while a voltage at the secondary side 308 is reflected to a primary voltage at the primary side. The diode D1 316 is forward biased, and the gate of the switch 322 is charged with an equivalent capacitance Cg2 322 (e.g., a representation of a gate capacitance of the switch 320) until Idm is extinguished or a start of a next switching cycle occurs. Each charge packet from the primary side 306 to the secondary side 308 of the transformer 310 will increase a voltage across the equivalent capacitance Cg2 322 until a voltage threshold across Cg2 is reached, which does not allow for any more forward bias of the diode D1 316.

In an embodiment, a winding ratio for the transformer 310 can be changed for a higher output voltage. In this way, when the energy transfer starts, there is energy through diode D1 316 and sink current through the diode D2, which will pull up a voltage (e.g., an output voltage) of a top plate of the equivalent capacitance Cg2 322 and pull down a voltage of a bottom plate of the equivalent capacitance Cg1 (e.g., a gate capacitance at the depletion n channel MOSFET) so that the passive turn off device 318 is disabled from deactivating the switch 320 (e.g., the passive turn off device 318 is disabled during energy transfer) while the voltage across the equivalent capacitance Cg2 322 is increased from the energy transfer through the diode D1 316. The equivalent capacitance Cg1 represents a gate capacitance of the passive turn off device 318. When the switching of the primary side is active (e.g., On-Off keying is active), the resistance R1 (a resistor R1) is used as a particular amount of load (e.g. a load below a threshold load) that will not adversely impact the ability of the negative charge pump 324 to adequately pump the equivalent gate capacitance Cg1 of the passive turn off device 318 so that the gate voltage of the passive turn off device 318 is more negative than the source voltage of the passive turn off device 318. That is, the resistance R1 does not prevent the negative charge pump 324 from disabling the passive turn off device 318 while loading the negative charge pump 324 because the resistance R1 may be set to be used as a load below a load threshold so as to not overload the negative charge pump 324. As soon as switching of the primary side is stopped (e.g., On-Off keying is inactive), the negative charge pump 324 cannot pump any more the gate voltage of the passive turn off device 318 more negative than the source voltage. Hence, the resistance R1 can start discharging the equivalent capacitance Cg1, thereby bringing the gate and the source of the equivalent capacitance Cg1 to a same voltage again.

The resistance R1 corresponds to a design parameter, since the resistance R1 should have at least a threshold resistance so that the negative charge pump 324 is not overloaded while the switching of the primary side is active (e.g., the On-Off keying is active), with an undesirable consequence of hindering and/or preventing the pulling down of the gate of the passive turn off device 318 with respect to the source due to the negative charge pump 324 otherwise being overloaded. At the same time, the resistance R1 should be low enough to discharge the equivalent capacitance Cg1 in a reasonable time if the switching of the primary side is stopped (e.g., the On-Off keying is inactive). The discharge time of the equivalent capacitance Cg1, which is determined by the resistance R1, will determine the off speed of the switch 320. Thus, the sizing the resistance R1 comes from a tradeoff between the deactivation effectiveness of the passive turn off device 318 and the turn off speed of the switch 320.

To avoid saturation of the transformer 310, the flyback converter is operated in a discontinuous conduction mode (DCM) so that Idm (e.g., magnetic energy stored within the transformer 310) discharges to 0 after each switching cycle without building up energy between switching cycles. Thus, the duty cycle for the input switch 304 is set so that during the time the input switch 304 is turned on, Im does not become too high and Idm is completely discharged when the input switch 304 is off. This avoids reverse recovery losses of the diode D1 316 since all current flowing into the forward biased diode D1 316 is extinguished when the diode D1 316 is reversed biased.

The flyback converter is utilized as a voltage conversion device. The flyback converter converts the energy from the input voltage to an output voltage to control the switch 320. In this way, the voltage across the equivalent capacitance Cg2 322 (e.g., the output voltage) can be relatively larger than an input voltage of the input source 302.

The passive turn off device 318 (e.g., the depletion n channel MOSFET) is used in parallel with the equivalent capacitance Cg2 322 to ensure passive turn off of the switch 320. While in a quiet steady state where no energy transfer is active and the input switch 304 is off, capacitors (e.g., equivalent capacitances) are discharged. Thus, a source and a gate at the depletion n channel MOSFET are at a same potential and a conduction channel is present between the source and the drain. This conduction channel acts like a resistor, sized based upon dimensions of the depletion n channel MOSFET, which deactivates the switch 320 (e.g., a turn off strength is applied between a gate and a source of the switch 320). The depletion n channel MOSFET is deactivated when the On-Off Keying starts to turn on the input switch 304 to start energy transfer so that a voltage at the equivalent capacitance Cg2 322 can be increased from 0 to a required voltage for reliably turning on the switch 320.

While the input switch 304 is on, the diode D1 316 is reversed biased and the diode D2 is forward biased, leading to a negative charge of the equivalent capacitance Cg1 (e.g., the gate capacitance at the depletion n channel MOSFET). While the input switch 304 is off, the diode D1 316 is forward biased and the diode D2 316 is reversed biased while the equivalent capacitance Cg1 continues to keep/retain charge and voltage compatibly to a discharge rate caused by a passive discharge element such as resistance R1. Thus, switching cycle after switching cycle, the gate of the depletion n channel MOSFET (passive turn off device 318) can be negatively pumped below a source potential, compatibly to the loading of resistance R1, leading to a deactivation of the depletion n channel MOSFET (passive turn off device 318) and to an increase of a driving voltage of the switch 320, which is then turned on. Once the On-Off Keying switching activity is stopped to turn off the input switch 304, the resistance R1 discharges the depletion n channel MOSFET (passive turn off device 318) so that the depletion n channel MOSFET (passive turn off device 318) becomes conductive to turn off the switch 320.

FIG. 4A illustrates an embodiment of an apparatus 400 for operating a switch 432 through a transformer 404 used as an isolation barrier, and FIG. 4B illustrates an embodiment of the apparatus 400 for operating the switch 432 through a capacitive coupling 456 used as the isolation barrier. The transformer 404 of FIG. 4A comprises a primary side 412 connected to an input side 402 of the apparatus 400 and a secondary side 410 connected to an output side 406 of the apparatus 400. The capacitive coupling 456 of FIG. 4B comprises one or more capacitors, such as a first capacitor 452 and a second capacitor 454, positioned between the input side 402 and the output side 406 of the apparatus 400. These isolation barriers provide for electrical isolation between the input side 402 and the output side 406 of the apparatus 400.

The apparatus 400 utilizes a voltage multiplier 414 (e.g., a Cockroft-Walton multiplier) as a voltage conversion device to convert energy from an input voltage of the input side 402 (e.g., energy transmitted from an input source 416 through an isolation barrier to the output side 406) to an output voltage to control the switch 432. The voltage multiplier 414 comprises one or more stages. Each stage comprises a diode and a capacitor/capacitance (e.g., capacitor CP1 and diode D2 as a first stage, capacitor CP2 and diode D3 as a second stage, capacitor CP3 and diode D4 as a third stage, etc.). The voltage multiplier 414 converts the input voltage to the output voltage, which may be a higher voltage than the input voltage in order to turn on the switch 432.

The apparatus 400 may comprise one or more input switches located at the input side 402, such as the first input switch SW1 418, the second input switch SW1b 422, the third input switch SW2A 420, and the fourth input switch SW2B 424, that are controlled by On-Off Keying to perform a sequence of switching cycles to transfer energy from the input side 402 to the output side 406 for controlling, such as turning on, the switch 432 at the output side 406.

The one or more input switches are operated in a manner to drive the input side 402 of the isolation barrier (e.g., the primary side 412 of the transformer 404 of FIG. 4A or an input side of the first capacitor 452 and the second capacitor 454 of the capacitive coupling 456 of FIG. 4B) in a push and pull manner. During a first phase of a switching cycle, an input current flows from a top terminal of the isolation barrier (e.g., a connection on the input side 402 to a top terminal of the primary side 412 of the transformer 404 or a connection on the input side 402 to the first capacitor 452 of the capacitive coupling 456) to a bottom terminal of the isolation barrier (e.g., a connection on the input side 402 to a bottom terminal of the primary side 412 of the transformer 404 or a connection on the input side 402 to the second capacitor 454 of the capacitive coupling 456). In particular, the top terminal is pulled up and the bottom terminal is pulled down. Capacitor CP1, capacitor CP3, and capacitor CP5 are charged through diode D2, diode D4, and diode D6, while diode D3 and diode D5 are reverse biased. During a second phase of the switching cycle, the current flows from the bottom terminal to the top terminal of the isolation barrier. In particular, the top terminal is pulled down and the bottom terminal is pulled up. Capacitor CP2 and capacitor CP4 are charged through diode D3 and diode D5, while diode D2, diode D4, and diode D6 are reverse biased. A duty cycle of 50% may be set for symmetry. A switching frequency may be set during each phase to a frequency value that does not cause the insolation barrier to reach/exceed saturation and/or cause reliability issues.

Similar to the apparatus 300 of FIG. 3, the apparatus 400 of FIGS. 4A and 4B comprises the switch 432, a passive turn off device 428 (e.g., a depletion n channel MOSFET), an equivalent capacitance Cg2 430 (e.g., a representation of a gate capacitance of the switch 432), and a charge pump 408 comprising an equivalent capacitance Cg1 such as a gate capacitance at the depletion n channel MOSFET, a passive discharge element such as a resistance R1, and a diode D1 similar to the diode D2 of FIG. 3 located at the output side 406 of the apparatus 400. These components/elements of apparatus 400 may operate similar to corresponding components/elements of apparatus 300 in order to turn on and off the switch 432.

The methods and apparatuses provided herein are capable of controlling a switch, such as a solid state switch or other type of switch, across an isolation barrier. The switch can be turned on and off without additional energy consumption at an output side of the insolation barrier where the switch is located. The isolation barrier provides electrical isolation between an input side of the isolation barrier and the output side of the isolation barrier. Electrical isolation is provided without introducing topological differences or penalties. This allows for a simple exchange of an apparatus with electrical isolation with other devices because the apparatus will have a similar/same size, package, and/or pinout. It may be appreciated that the methods and apparatuses may be implemented for any type of device, such as a computer, a mobile device, an electronic device, a device that utilizes a switch, etc.

An embodiment of the presently disclosed techniques comprises a method. The method comprises operating one or more input switches of an input side of an isolation device according to a frequency and a duty cycle to transfer energy through the isolation device during a sequence of switching cycles to an output side of the isolation device for activating a switch, wherein a voltage conversion device converts the energy from an input voltage of the input side to an output voltage to control the switch and a passive turn off device is disabled from deactivating the switch when the energy transfer is active, wherein the passive turn off device passively deactivates the switch when the energy transfer is inactive.

According to some embodiments, the method comprises utilizing a negative charge pump at the output side to actively drive down a gate of the passive turn off device using a negative voltage to disable the passive turn off device from deactivating the switch when the energy transfer is active.

According to some embodiments, the negative charge pump pumps a gate of the passive turn off device below a source of the passive turn off device for deactivating the passive turn off device, and wherein a passive discharge element loads the negative charge pump to bring the source and the gate to a same voltage.

According to some embodiments, operating the one or more input switches comprises utilizing an On-Off Keying technique to perform a plurality of switching cycles for transferring the energy through the isolation device to operate the switch.

According to some embodiments, the passive turn off device comprises a depletion MOSFET.

According to some embodiments, the voltage conversion device comprises a voltage multiplier.

According to some embodiments, the voltage conversion device comprises a flyback converter.

According to some embodiments, the voltage conversion device generates the output voltage to be higher than the input voltage.

According to some embodiments, the isolation device comprises a transformer.

According to some embodiments, the isolation device comprises a capacitive coupling.

An embodiment of the presently disclosed techniques comprises an apparatus, comprising a means for operating one or more input switches of an input side of an isolation device according to a frequency and a duty cycle to transfer energy through the isolation device during a sequence of switching cycles to an output side of the isolation device for activating a switch, wherein a voltage conversion device converts the energy from an input voltage of the input side to an output voltage to control the switch and a passive turn off device is disabled from deactivating the switch when the energy transfer is active, wherein the passive turn off device passively deactivates the switch when the energy transfer is inactive.

An embodiment of the presently disclosed techniques comprises an apparatus. The apparatus comprises an energy transfer device configured to operate one or more input switches of an input side of an isolation device according to a frequency and a duty cycle to transfer energy through the isolation device during a sequence of switching cycles to an output side of the isolation device for activating a switch; a voltage conversion device configured to convert the energy from an input voltage of the input side to an output voltage to control the switch when the energy transfer is active; a passive turn off device configured to passively deactivate the switch when the energy transfer is inactive; and a negative charge pump configured to disable the passive turn off device from deactivating the switch when the energy transfer is active.

According to some embodiments, the energy transfer device is located at the input side of the isolation device, and the passive turn off device, the negative charge pump, and the switch are located at the output side of the isolation device.

According to some embodiments, the voltage conversion device comprises a voltage multiplier, and the isolation device comprises a transformer.

According to some embodiments, the voltage conversion device comprises a voltage multiplier, and the isolation device comprises a capacitive coupling.

According to some embodiments, the voltage conversion device comprises a flyback converter, and the isolation device comprises a transformer.

According to some embodiments, the voltage conversion device comprises a voltage multiplier, and the energy transfer device is configured to: drive the energy to the isolation device in a push and pull manner, wherein the switching cycle comprises a first phase where input current flows from a top terminal of the isolation device to a bottom terminal of the isolation device, and a second phase where the input current flows from the bottom terminal to the top terminal.

An embodiment of the presently disclosed techniques comprises an apparatus. The apparatus comprises an energy transfer device configured to operate one or more input switches of an input side of an electrical isolation device to transfer energy through the isolation device to an output side of the electrical isolation device for activating a switch; a voltage conversion device configured to convert the energy from an input voltage of the input side to an output voltage to control the switch when the energy transfer is active; and a passive turn off device configured to passively deactivate the switch when the energy transfer is inactive, wherein the passive turn off device is disabled from deactivating the switch when the energy transfer is active.

According to some embodiments, the electrical isolation device provides galvanic isolation between the input side and the output side.

According to some embodiments, the energy transfer device is configured to operate a first switch, a second switch, a third switch, and a fourth switch to perform a plurality of switching cycles for transferring the energy through the isolation device.

According to some embodiments, the voltage conversion device comprises one or more stages, wherein a stage of the one or more stages comprises a diode and a capacitor.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method, comprising:
operating one or more input switches of an input side of an isolation device according to a frequency and a duty cycle to transfer energy through the isolation device during a sequence of switching cycles implemented by an On-Off Keying technique to an output side of the isolation device for activating a switch, wherein a voltage conversion device converts the energy from an input voltage of the input side to an output voltage to control the switch and a passive turn off device is disabled from deactivating the switch when the energy transfer is active, wherein the passive turn off device passively deactivates the switch when the energy transfer is inactive, wherein a switching cycle of the On-Off Keying technique includes:
generating a negative voltage at the output side using a negative charge pump;
starting an On-Off Keying process to drive a gate of a passive turn off device below a source to stop the passive turn off device from conducting; and
stopping the On-Off Keying process to discharge the negative voltage to enable the passive turn off device to conduct.

2. The method of claim 1, comprising:
utilizing the negative charge pump at the output side to actively drive down the gate of the passive turn off device using the negative voltage to disable the passive turn off device from deactivating the switch when the energy transfer is active.

3. The method of claim 2, wherein the negative charge pump pumps the gate of the passive turn off device below the source of the passive turn off device for deactivating the passive turn off device, and wherein a passive discharge element loads the negative charge pump to bring the source and the gate to a same voltage.

4. The method of claim 1, wherein operating the one or more input switches comprise:

utilizing the On-Off Keying technique to perform a plurality of switching cycles for transferring the energy through the isolation device to operate the switch.

5. The method of claim 1, wherein the passive turn off device comprises a depletion MOSFET.

6. The method of claim 1, wherein the voltage conversion device comprises a voltage multiplier.

7. The method of claim 1, comprising a flyback converter.

8. The method of claim 1, wherein the voltage conversion device generates the output voltage to be higher than the input voltage.

9. The method of claim 1, wherein the isolation device comprises a transformer.

10. The method of claim 1, wherein the isolation device comprises a capacitive coupling.

11. An apparatus comprising:
 an energy transfer device configured to operate one or more input switches of an input side of an isolation device according to a frequency and a duty cycle to transfer energy through the isolation device during a sequence of switching cycles to an output side of the isolation device for activating a switch;
 a voltage conversion device configured to convert the energy from an input voltage of the input side to an output voltage to control the switch when the energy transfer is active, wherein the isolation device for activating the switch further comprises voltage generation capabilities to generate output voltages at the output side, provides common mode transient immunity between the input side and the output side, and provides pin to pin compatibility that utilizes a standard pin layout of the apparatus;
 a passive turn off device configured to passively deactivate the switch when the energy transfer is inactive; and
 a negative charge pump configured to disable the passive turn off device from deactivating the switch when the energy transfer is active.

12. The apparatus of claim 11, wherein the energy transfer device is located at the input side of the isolation device, and the passive turn off device, the negative charge pump, and the switch are located at the output side of the isolation device.

13. The apparatus of claim 11, wherein the voltage conversion device comprises a voltage multiplier, and the isolation device comprises a transformer.

14. The apparatus of claim 11, wherein the voltage conversion device comprises a voltage multiplier, and the isolation device comprises a capacitive coupling.

15. The apparatus of claim 11, comprising a flyback converter, and wherein the isolation device comprises a transformer.

16. The apparatus of claim 11, wherein the voltage conversion device comprises a voltage multiplier, and the energy transfer device is configured to:
 drive the energy to the isolation device in a push and pull manner, wherein the switching cycle comprises a first phase where input current flows from a top terminal of the isolation device to a bottom terminal of the isolation device, and a second phase where the input current flows from the bottom terminal to the top terminal.

17. An apparatus comprising:
 an energy transfer device configured to operate one or more input switches of an input side of an electrical isolation device to transfer energy through the isolation device to an output side of the electrical isolation device for activating a switch;
 a voltage conversion device configured to convert the energy from an input voltage of the input side to an output voltage to control the switch when the energy transfer is active, wherein the isolation device for activating the switch further comprises voltage generation capabilities to generate output voltages at the output side, provides common mode transient immunity between the input side and the output side, and provides pin to pin compatibility that utilizes a standard pin layout of the apparatus without additional power pins; and
 a passive turn off device configured to passively deactivate the switch when the energy transfer is inactive, wherein the passive turn off device is disabled from deactivating the switch when the energy transfer is active.

18. The apparatus of claim 17, wherein the electrical isolation device provides galvanic isolation between the input side and the output side.

19. The apparatus of claim 17, wherein the energy transfer device is configured to operate a first switch, a second switch, a third switch, and a fourth switch to perform a plurality of switching cycles for transferring the energy through the isolation device.

20. The apparatus of claim 17, wherein the voltage conversion device comprises one or more stages, wherein a stage of the one or more stages comprises a diode and a capacitor.

\* \* \* \* \*